United States Patent
Yang et al.

(10) Patent No.: US 7,973,314 B2
(45) Date of Patent: Jul. 5, 2011

(54) SEMICONDUCTOR DEVICE AND METHOD OF MANUFACTURING THE SAME

(75) Inventors: Seung-Jin Yang, Seoul (KR); Jeong-Uk Han, Suwon-si (KR); Yong-Tae Kim, Yongin-si (KR); Yong-Suk Choi, Hwaseong-si (KR); Hyok-Ki Kwon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 12/117,630

(22) Filed: May 8, 2008

(65) Prior Publication Data

US 2008/0283873 A1    Nov. 20, 2008

(30) Foreign Application Priority Data

May 14, 2007    (KR) .................. 10-2007-0046615

(51) Int. Cl.
*H01L 29/76*    (2006.01)
*H01L 31/036*    (2006.01)
*H01L 31/112*    (2006.01)

(52) U.S. Cl. ................ 257/67; 257/316; 257/E21.614
(58) Field of Classification Search ............. 257/67–70, 257/E21.614, 316
See application file for complete search history.

(56) References Cited

U.S. PATENT DOCUMENTS 5,321,286 A * 6/1994 Koyama et al. ............... 257/315

FOREIGN PATENT DOCUMENTS

| | | |
|---|---|---|
| JP | 2001-290171 | 10/2001 |
| JP | 2002-368141 | 12/2002 |
| JP | 2005-109498 | 4/2005 |
| JP | 2006-203250 | 8/2006 |
| JP | 2006286752 | 10/2006 |
| KR | 102000043216 A | 7/2000 |
| KR | 1020040008487 A | 1/2004 |
| KR | 1020050015498 A | 2/2005 |
| KR | 1020060097892 A | 9/2006 |

* cited by examiner

*Primary Examiner* — Thien F Tran
(74) *Attorney, Agent, or Firm* — Volentine & Whitt, PLLC

(57) ABSTRACT

A semiconductor device has a first semiconductor layer including a first circuit, a second semiconductor layer disposed on the first semiconductor layer and having a second circuit, and a via extending through portions of the first and second semiconductor layers and by which the first and second circuits are electrically connected. One of the circuits is a logic circuit and the other of the circuits is a memory circuit. The semiconductor device is manufactured by fabricating transistors of the logic and memory circuits on respective substrates, stacking the substrates, and electrically connecting the logic and memory circuits with a via.

14 Claims, 12 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same. More particularly, the present invention relates to a semiconductor device having a multi-layered structure of a high voltage circuit and a low voltage circuit and to a method of manufacturing the same.

In system-on-chip (SoC) memory devices, a memory circuit and an input/output (I/O) operating at high voltage, and a logic circuit operating at low voltage are formed in a single layer. However, the manufacturing of a memory device having such a single-layered structure is complex because a gate oxide layer of the high voltage circuit and a gate oxide layer of the low voltage circuit have different thicknesses. For example, a relatively thick gate oxide layer of the high voltage circuit and a relatively thin gate oxide layer of the low voltage circuit are formed by forming an oxide layer on a substrate, removing a portion of the oxide layer, and then forming an oxide layer again on a region from which the portion of the oxide layer was removed.

In the above-described method of forming gate oxide layers of different thicknesses on a single substrate of an SoC device, it is difficult to ensure that the oxide layers of each circuit operating at the same voltage have uniform thicknesses. Also, it is difficult to scale down such SoC structures because the size of the memory regions of SoC devices is gradually increasing. In addition, it is also difficult to scale down an SoC device while simultaneously enabling memory circuits of various sizes to be mounted to meet user requirements.

SUMMARY OF THE INVENTION

An object of the present invention is to provide a small scale semiconductor device by which various different types and/or sizes of memory circuits can be provided along with a universal logic circuit.

Another object of the present invention is to provide a method by which such a semiconductor device can be manufactured.

Still another object of the present invention is to provide a semiconductor device having transistors whose gate insulation layers have different thicknesses, and which device is easy to manufacture by virtue of its design.

Likewise, another object of the present invention is to provide a method of readily manufacturing a semiconductor device having transistors whose gate insulation layers have different thicknesses.

According to one aspect of the invention, there is provided a multi-layered system on chip structure having a first layer including a first patterned gate oxide layer, a second layer stacked on the first layer and including a second patterned gate oxide layer, and wherein the thickness of the first patterned gate oxide layer is different from the thickness of the second patterned gate oxide layer.

According to one aspect of the invention, there is provided a semiconductor device including a logic circuit and a memory circuit stacked one atop the other in respective layers, and a via by which the logic and memory circuits are electrically connected.

According to another aspect of the invention, there is provided a semiconductor device including a first semiconductor layer made up of a first substrate and a first circuit including a first transistor disposed on the first substrate, a second semiconductor layer made up of a second substrate disposed on the first semiconductor layer and a second circuit including a second transistor disposed on the second substrate, a via by which the first and second circuits are electrically connected, and wherein the thickness of the gate insulation layer of the first transistor is different from the thickness of the gate insulation layers of the second transistor.

In this case, one of the first and second circuits may be a logic circuit, and the other of the first and second circuits may be a memory circuit. The logic circuit preferably is a low voltage circuit operating at relatively low voltage, whereas the memory circuit is preferably a high voltage circuit operating at voltage that is higher than that at which the logic circuit operates. In this case, the gate insulation layer of the transistor of the logic circuit is thinner than the gate insulation layer of the transistor of the memory circuit.

Preferably, the first circuit is the logic circuit and the second circuit is the memory circuit. The logic circuit includes insulation covering the first transistor. The memory circuit includes a bit line electrically connected to the second transistor, and insulation covering the second transistor and the bit line. The via extends through the insulation of the first layer and the second semiconductor substrate. The memory circuit may also include a plug extending through the insulation of the second layer and electrically connecting the bit line and the via. Also, the memory circuit may include a double well structure, i.e., a first well and a second well disposed in the first well.

According to still another aspect of the present invention, there is provided a method of manufacturing a semiconductor device, which includes providing a first semiconductor layer having a first circuit, forming a first via hole in the first semiconductor layer to such an extent as to expose an inner region of the first semiconductor layer, providing a second semiconductor layer having a second circuit, forming a second via hole in the second semiconductor layer, stacking the first and second semiconductor layers such that the first via hole is aligned with the second via hole, and filling the first and second via holes to form a via.

The first semiconductor layer may be provided by fabricating a first transistor on a first semiconductor substrate, and forming a first insulation layer on the first semiconductor substrate so as to cover the first transistor. The first via hole is formed to expose a junction region of the first transistor.

The second semiconductor layer may be provided by fabricating a second transistor on a second semiconductor substrate. Also, the second via hole is formed so as to extend through the second semiconductor substrate. In addition, a second insulation layer is formed on the second semiconductor substrate so as to cover the second transistor. Preferably, the thickness of the gate insulation layer of the second transistor is different from the thickness of the gate insulation layer of the first substrate.

The first and second via holes may be filled with conductive material to form the via before the second insulation layer is formed. In this case, a portion of the second insulation layer may be removed to form a via hole exposing the top of the via. The via hole in the second insulation layer is filled with conductive material to form a via plug connected to the via.

Alternatively, the second via hole may be formed after the second insulation layer is formed. In this case, the second via hole is formed in the second insulation layer and the second substrate. At the same time, a contact hole may be formed in the second insulation layer to expose a junction region of the second transistor. The contact hole and the second via hole may be formed sequentially instead of simultaneously. In either case, the contact hole and the second via hole are filled at the same time with conductive material to form a contact plug connected to the junction region of the second transistor, and the via, respectively.

A bit line, connected to the contact plug and to the via or via plug, may also be formed on the second insulation layer. Then, a third insulation layer may be formed to cover the bit line.

According to yet another aspect of the present invention, there is provided a method of manufacturing a semiconductor device, which includes providing a first semiconductor layer having a first circuit disposed on a first semiconductor substrate, providing a second semiconductor layer having a second circuit disposed on a second semiconductor substrate, forming a via hole which extends in the second semiconductor layer and exposes the first semiconductor substrate, and electrically connecting the first and second circuits including by filling the via hole with conductive material to form a via.

DETAILED DESCRIPTION OF PREFERRED EMBODIMENTS

Figure 1A:
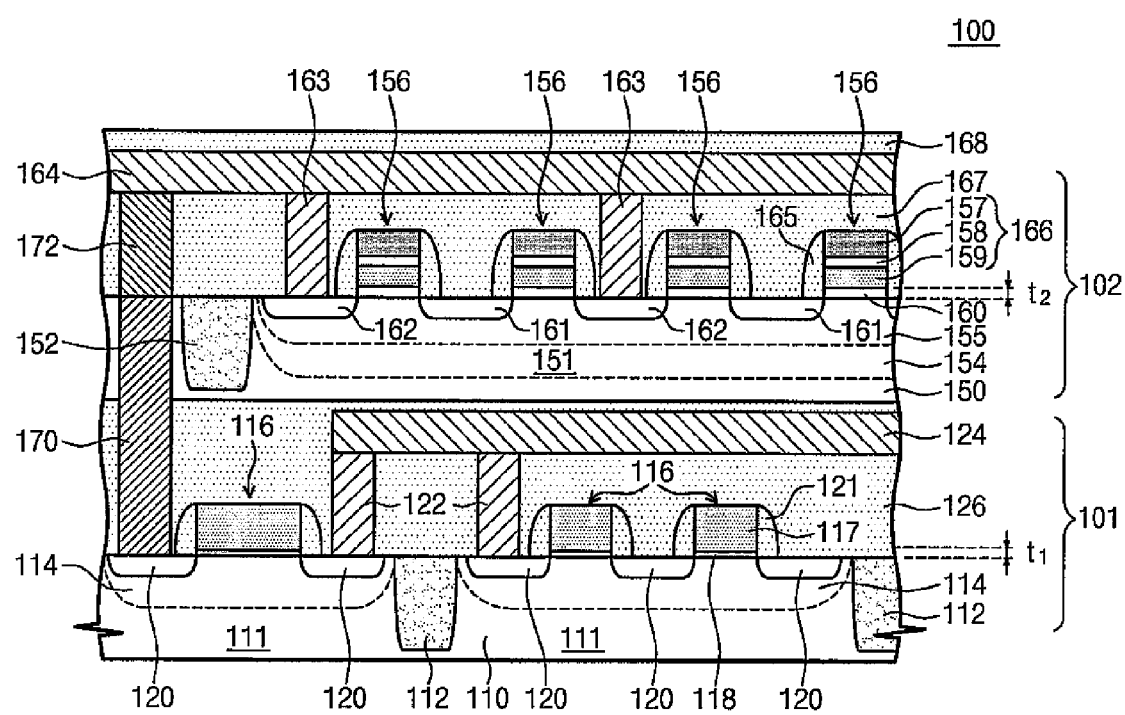
FIG. 1A is a sectional view of an embodiment of a semiconductor device according to the present invention.

The present invention will be described below in more detail with reference to the accompanying drawings. It is to be noted, though, that the dimensions of layers and regions are exaggerated in the drawings for clarity of illustration. Also, like reference numerals designate like elements throughout the drawings.

Furthermore, when a layer (or film) is referred to in the written description as being 'on' another layer or substrate, it means that such a layer (or film) can be directly on the other layer or substrate, or that one or more other layers may be present therebetween. Also, when a layer (or film) is referred to as being 'under' another layer, it means that the layer (or film) can be directly under the other layer, or that one or more other layers may be present therebetween. In addition, when a layer (or film) is referred to as being 'between' two layers, it means that the layer (or film) may be the only layer (or film) between the two layers, or that one or more other layers may also be present between the two layers.

Referring now to FIG. 1A, a semiconductor device 100 includes a first semiconductor layer 101, a second semiconductor layer 102, and a via 170. The first semiconductor layer 101 may include a logic circuit. The second semiconductor layer 102 may be stacked on the first semiconductor layer 101 and may include a memory circuit. The logic circuit of the first semiconductor layer 101 and the memory circuit of the second semiconductor layer 102 are electrically connected to each other through the via 170. The logic circuit may operate at a low voltage while the memory circuit operates at a high voltage. Alternatively, the logic circuit may operate at a high voltage while the memory circuit operates at a low voltage. The present invention will be described further, though, with respect to an embodiment in which the logic circuit operates at a low voltage and the memory circuit operates at a high voltage.

The first semiconductor layer 101 also includes a first substrate 110 made of a semiconductor such as silicon (Si). The logic circuit of the first semiconductor layer 101 may be made up of a plurality of transistors 116 surrounded by an insulation layer 126. In addition, device isolation layers 112 define an active region 111 in the first substrate 110. A low voltage well 114 may be disposed in the active region 111. Each of the transistors 116 may include a gate 117, a gate insulation layer 118, a spacer 121, and a junction region 120. Also, each transistor 116 is electrically connected to a metal interconnection 124 through a contact plug 122 that is electrically connected to a junction region 120. Furthermore, in the present embodiment, the gate insulation layer 118 of each of the transistors of the logic circuit comprises a silicon oxide layer having a relatively small thickness $t_1$ of about 15 Å to about 40 Å, i.e., may be relatively thin compared to the gate insulation layer of the transistors of the memory circuit (described below). On the other hand, the widths of the gate oxide layers 118 of the various transistors 116 may vary throughout the first semiconductor layer 101.

The second semiconductor layer 102 also includes a substrate 150 made of a semiconductor such as silicon (Si). Also, the memory circuit of the second semiconductor layer 102 may be a NOR flash memory circuit; however, the present invention is not limited thereto. For example, the memory circuit may be a NAND flash memory circuit or an electrically erasable programmable read only memory (EEPROM) circuit. Also, according to the present invention, the first semiconductor layer 101 may include a memory circuit, e.g., a NOR flash memory circuit, a NAND flash memory circuit or an EEPROM circuit, in which case the second semiconductor layer 102 includes a logic circuit.

In the present embodiment, though, the NOR flash memory circuit of the second semiconductor layer 102 includes a plurality of memory transistors 156 surrounded by insulation layers 167 and 168. Also, an active region 151 is defined in the second substrate 150 by a device isolation layer 152. The active region 151 has a double-well structure including a high voltage deep well 154 and a high voltage pocket well 155 disposed in the high voltage deep well 154, for example. The double-well structure is preferably used for electrically isolating memory arrays in units of a PAGE or a MAT from each other. Also, the high voltage deep well 154 and the high voltage pocket well 155 may have different conductivity types. For example, when the second substrate 150 has a p-type conductivity, the high voltage deep well 154 has an n-type conductivity and the high voltage pocket well 155 has a p-type conductivity.

Each of the transistors 156 of the second semiconductor layer 102 may include a gate pattern 166, a gate insulation layer 160, a spacer 165, and junction regions 161 and 162. The gate pattern 166 may include a floating gate 159, a blocking insulation layer 158 and a control gate 157 which are stacked one atop the other in the foregoing sequence. The floating gate 159 is electrically isolated to store a charge. The junction regions 161 may be source regions and thereby together serve as a common source line. On the other hand, the junction regions 162 may serve as drains for the transistors. In this case, each drain is electrically connected to a bit line 164 through a contact plug 163.

The gate insulation layer 160 of the memory circuit is a so-called tunnel insulation layer and may comprise a silicon oxide having a thickness $t_2$ of about 50 to about 70 Å, i.e., may be relatively thick compared to the gate insulation layer 118 of the logic circuit. According to the above-described embodiment, the relatively thin gate insulation layer 118 of the low voltage circuit is disposed on the first substrate 110 and the relatively thick gate insulation layer 160 of the high voltage circuit is disposed on the second substrate 150. Accordingly, this structure is much easier to manufacture than a conventional SoC device in which gate insulation layers of different thicknesses are formed on a single substrate.

Referring again to FIG. 1A, the via 170 extends from a junction region 120 of the first semiconductor layer 101 through the substrate 150 of the second semiconductor layer 102 and the insulation layer 126 of the first semiconductor layer 101. In this respect, the via 170 may be disposed in a lateralmost portion of the first and second semiconductor layers 101 and 102. Also, the second semiconductor layer 102 includes a via plug 172 electrically connecting the via 170 to the bit line 164. Thus, the bit line 164 is electrically connected to a junction region 120 of the first semiconductor layer 101.

Figure 1B:
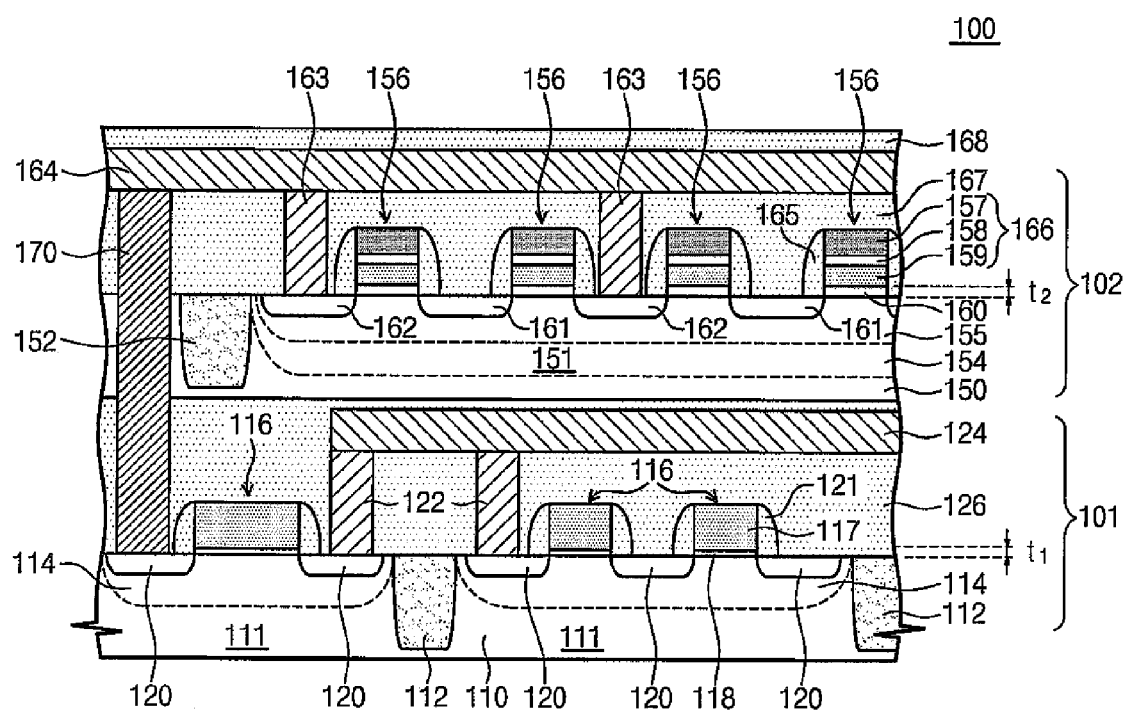
FIG. 1B is a sectional view of another embodiment of a semiconductor device according to the present invention.

FIG. 1B is a sectional view of another embodiment of a semiconductor device according to the present invention.

Referring to FIG. 1B, the via 170 extends through the insulation layer 167 and substrate 150 of the second semiconductor layer 102 and the insulation layer 126 of the first semiconductor layer 101 to directly connect the bit line 164 to a junction region 120 of the first semiconductor layer 101. The other elements and their structural relationships are similar to those described above with reference to FIG. 1A.

FIGS. 2A through 2E illustrate a method of manufacturing a semiconductor device according to the present invention.

Figure 2A:
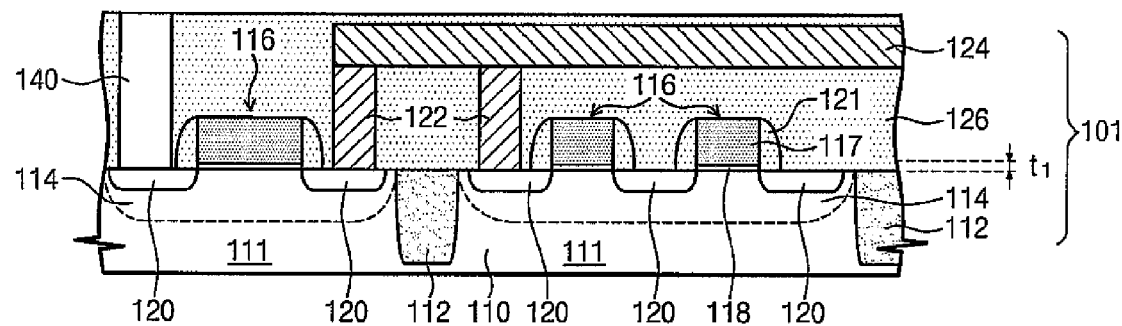
FIGS. 2A through 2E are sectional views illustrating an embodiment of a method of manufacturing a semiconductor device according to the present invention.

Referring to FIG. 2A, a first semiconductor layer 101 including a logic circuit surrounded by an insulation layer 126 is prepared. The logic circuit may operate at a relatively low voltage compared to a memory circuit of the device (described later). The logic circuit is fabricated by forming a plurality of transistors 116 on an active region 111 of the first substrate 110, by forming an insulation layer 126 on the transistors 116, by forming contact plugs 122 in the insulation layer 126, and by forming a metal interconnection 124 electrically connected to the transistors 116 through the contact plugs 122, all using well known processes. For example, a device isolation layer 112 is formed in a first substrate 110, made of a semiconductor, to define the active region 111. Ions are implanted into the active region 111 to form a low voltage well 114. Then, a plurality of transistors 116 each including a gate insulation layer 118, a gate 117, a spacer 121 and a junction region 120 are formed on the active region 111. The gate insulation layer 118 may be formed by depositing silicon oxide to a thickness $t_1$ of about 15 Å to about 40 Å on the substrate 111 and then patterning the silicon oxide along with the layer constituting the gate 117. Then, the insulation layer 126 is formed over the transistors 116. Next, the contact plugs 122 are formed in the insulation layer 126 such that the plugs 122 are each connected to a junction region 120, and a metal interconnection 124 is formed such that it is connected to the contact plugs 122. Subsequently, a portion of the insulation layer 126 is removed to form a first via hole 140 exposing a portion of one of the junction regions 120. The first via hole 140 is preferably formed in a lateralmost portion of the first semiconductor layer 101.

Figure 2B:
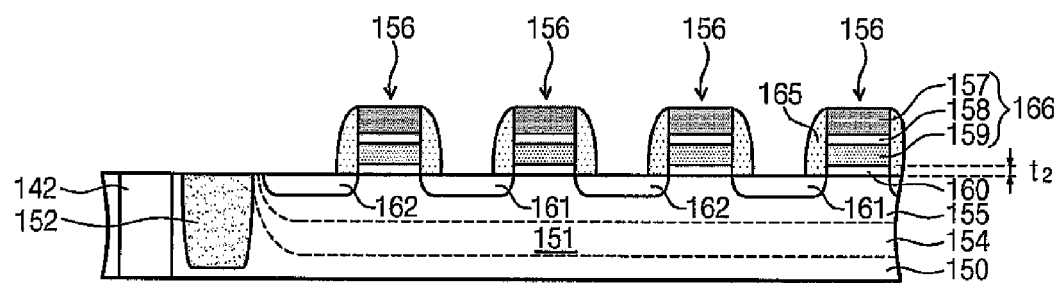

Referring to FIG. 2B, a second substrate 150 made of a semiconductor is prepared, and a plurality of memory transistors 156 are formed on an active region 151 of the substrate, using well-known processes per se. For example, a device isolation layer 152 is formed in the second substrate 150 to define the active region 151. Ions are implanted into the active region 151 to form a double well structure. The double well structure has a high voltage pocket well 155 of a second conductivity type disposed in a high voltage deep well 154 of a first conductivity type. For example, if the second substrate 150 has a p-type conductivity, the high voltage deep well 154 has an n-type conductivity and the high voltage pocket well 155 has a p-type conductivity. Subsequently, a plurality of transistors 156 each including a gate pattern 166, a gate insulation layer 160, a spacer 165 and junction regions 161 and 162 are formed on the active region 151 using well known processes. In this embodiment, the gate insulation layer 160 is a so-called tunnel insulation layer, and may be formed by depositing silicon oxide to a relatively great thickness $t_2$ of about 50 Å to about 70 Å on the second substrate 150. The gate pattern 166 may be made up of a floating gate 159, a blocking dielectric layer 158, and a control gate 157. The floating gate 159 is electrically isolated to store charge. The junction regions 161 may be source regions which together serve as a common source line, and the junction regions 162 may serve as drain regions electrically connected to a bit line (164 in FIG. 2E) which will described later. After the transistors 156 have been formed on the second substrate 150, a portion of the second substrate 150 is removed to form a second via hole 142 extending through the second substrate 150 in a vertical direction. The via hole 142 is preferably formed in a lateralmost portion of the second substrate 150.

Figure 2C:
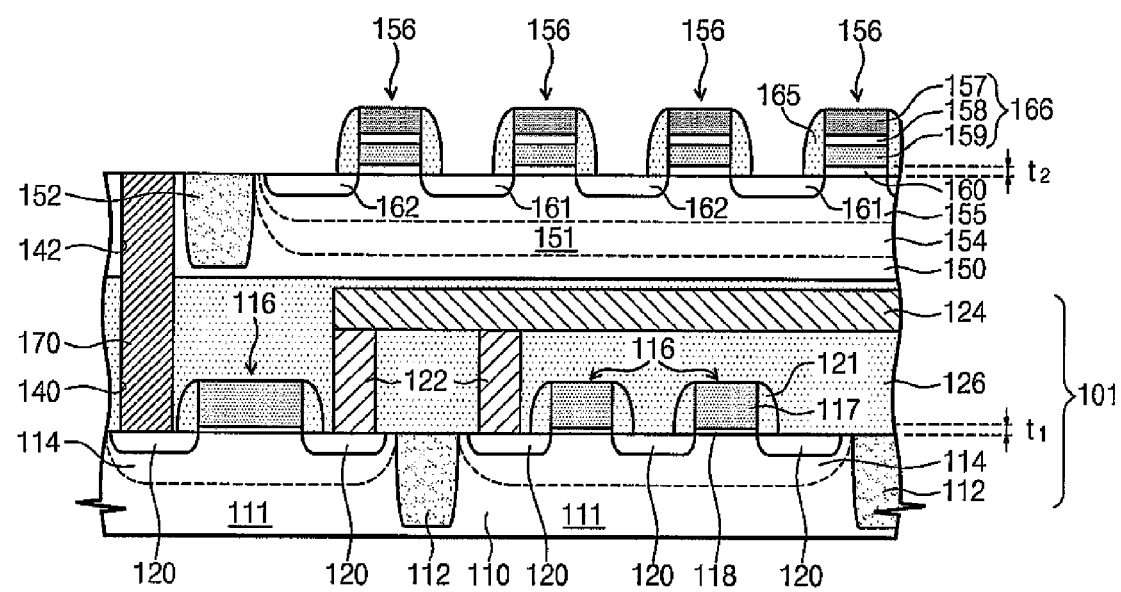

Referring to FIG. 2C, the second substrate 150 is stacked on the first semiconductor layer 101. At this time, the first via hole 140 is vertically aligned with the second via hole 142. Then, the first and second via holes 140 and 142 are filled with conductive material to form a via 170. The via 170 extends through the second substrate 150 and the insulation layer 126 of the first semiconductor 101 such that the via 170 is connected to a (lateralmost) junction region 120 of the first semiconductor layer 101.

Figure 2D:
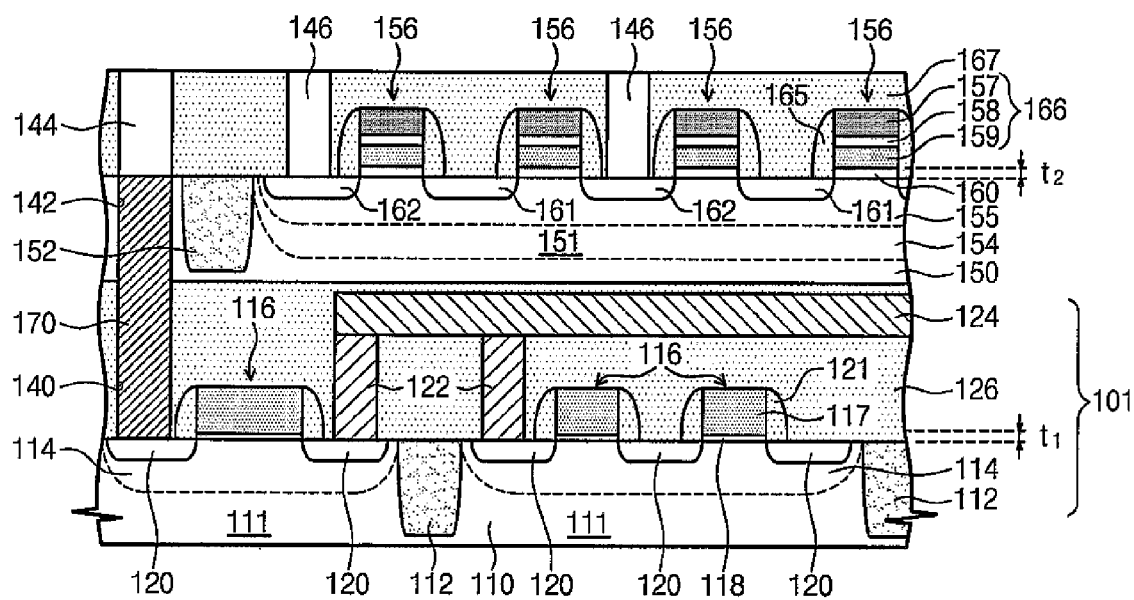

Referring to FIG. 2D, insulating material is deposited on the second substrate 150 to form an insulation layer 167 surrounding the transistors 156. Subsequently, a portion of the insulation layer 167 is removed to form contact holes 146 exposing the drains 162 and a third via hole 144 exposing the via 170. The contact holes 146 and the third via hole 144 may be formed simultaneously.

Figure 2E:
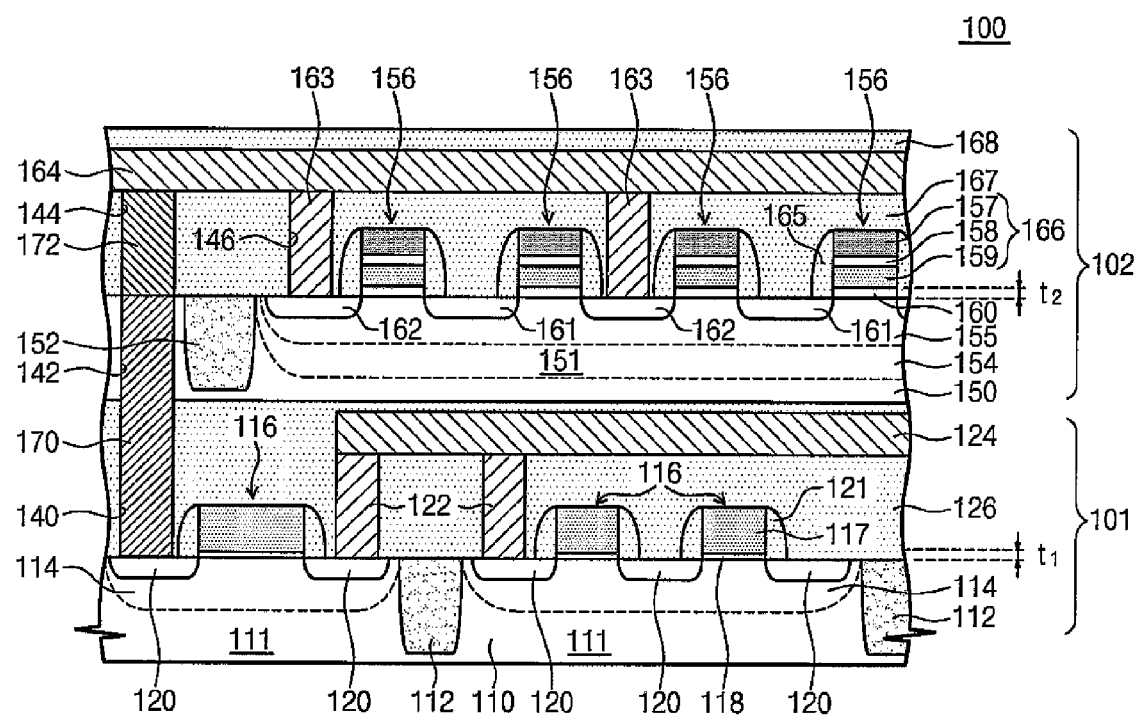

Referring to FIG. 2E, the contact holes 146 and the third via hole 144 are filled with conductive material to form contact plugs 163 and a via plug 172, respectively. The contact plugs 163 (collectively) and the via plug 172 may be formed simultaneously or sequentially. Next, conductive material is deposited on the insulation layer 167 and is patterned to form a bit line 164. The bit line 164 is electrically connected to the via plug 172 and thus to the via 170. The bit line 164 is also electrically connected to the contact plugs 163 and thus to the drains 162. Furthermore, an insulation layer 168 may be formed over the bit line 164. As a result, the logic circuit and the NOR flash memory circuit of the semiconductor device 100 are formed on the first substrate 110 and the second substrate 150, respectively, and the logic circuit and the NOR flash memory circuit are electrically connected to each other through the via 170. As mentioned above, though, the logic circuit may be formed on the second semiconductor layer 102 and the NOR flash memory circuit may be formed on the first semiconductor layer 101 according to the present invention.

In this case, steps similar to those described above may be carried out to form such a device. The sequence and specifics of such steps can be readily discerned from the description above and therefore, will not be described in detail for the sake of brevity.

FIGS. 3A through 3D illustrate another embodiment of a method of manufacturing a semiconductor device according to the present invention.

Figure 3A:
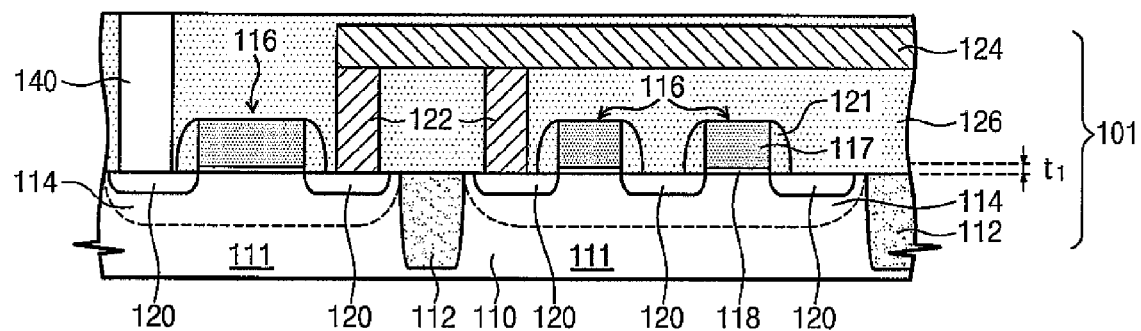
FIGS. 3A through 3D are sectional views illustrating another embodiment of a method of manufacturing a semiconductor device according to the present invention.

Referring to FIG. 3A, a first semiconductor layer 101 including a first substrate 110 on which a logic circuit is formed is prepared. The logic circuit includes a plurality of transistors 116. Also, an insulation layer 126 is formed over the transistors 116. The first semiconductor layer 101 may be prepared using the same method described above with reference to FIG. 2A. Next, a portion of the insulation layer 126 is removed to form a first via hole 140 exposing a (lateralmost) junction region 120.

Figure 3B:
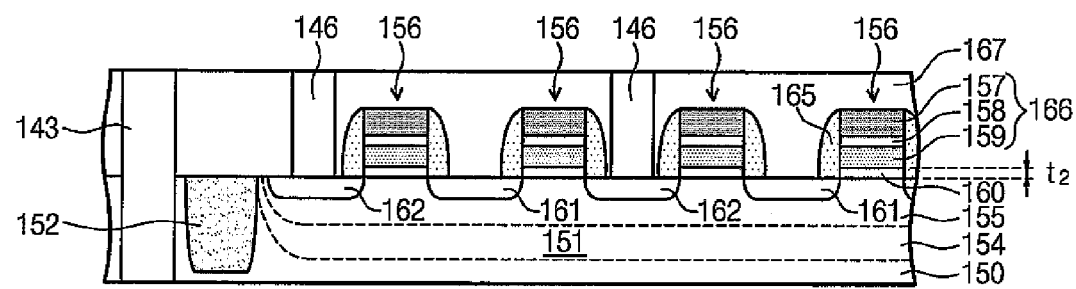

Referring to FIG. 3B, a second semiconductor substrate 150 on which a memory circuit is formed is prepared. The memory circuit includes a plurality of memory transistors 156. The transistors 156 may be fabricated using the same method described above with reference to FIG. 2B. Subsequently, insulating material is deposited on the second substrate 150 to form an insulation layer 167 over the transistors 167. Next, a portion of the insulation layer 167 is removed to form contact holes 146 exposing drains 162, respectively, and a portion of the insulation layer 167 and a portion of the second substrate 150 are removed to form a second via hole 143 extending vertically through the insulation layer 167 and the second substrate 150. The contact holes 146 (collectively) and the second via hole 143 may be formed simultaneously or sequentially.

Figure 3C:
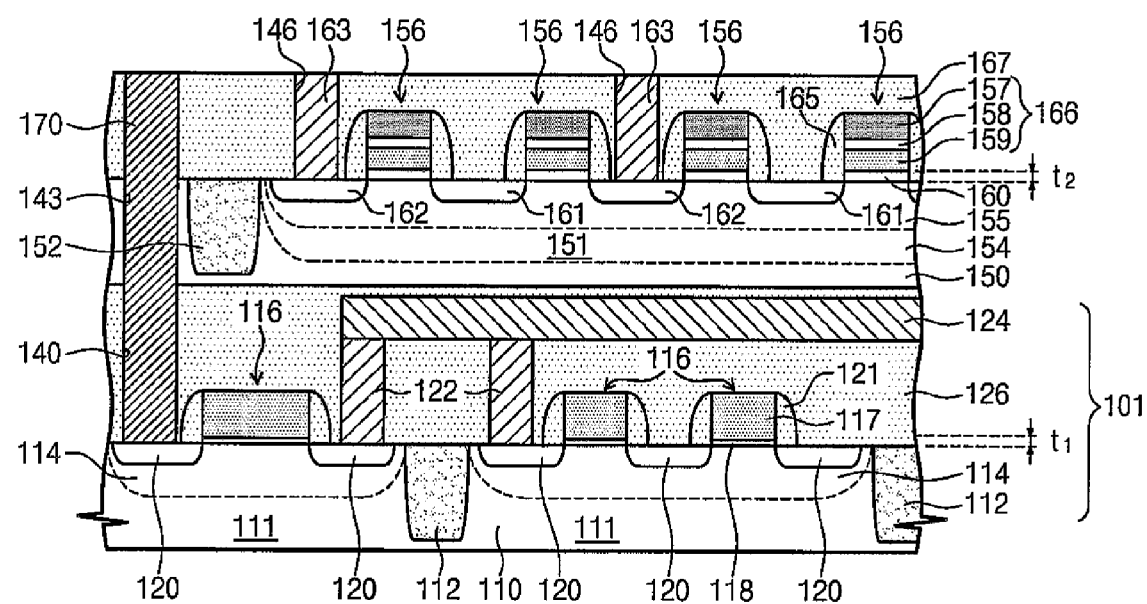

Referring to FIG. 3C, the second substrate 150 is stacked on the first semiconductor layer 101. At this time, the first via hole 140 is aligned with the second via hole 143. Subsequently, the first and second via holes 140 and 143 are filled with conductive material to form a via 170, and the contact holes 146 are filled with conductive material to form contact plugs 163. The contact plugs 163 (collectively) and the via 170 may be formed simultaneously or sequentially. The via 170 extends through the insulation layer 126, the second substrate 150 and the insulation layer 167 such that the via 170 is connected to a (lattermost) junction region 120 of the first semiconductor layer 101.

Figure 3D:
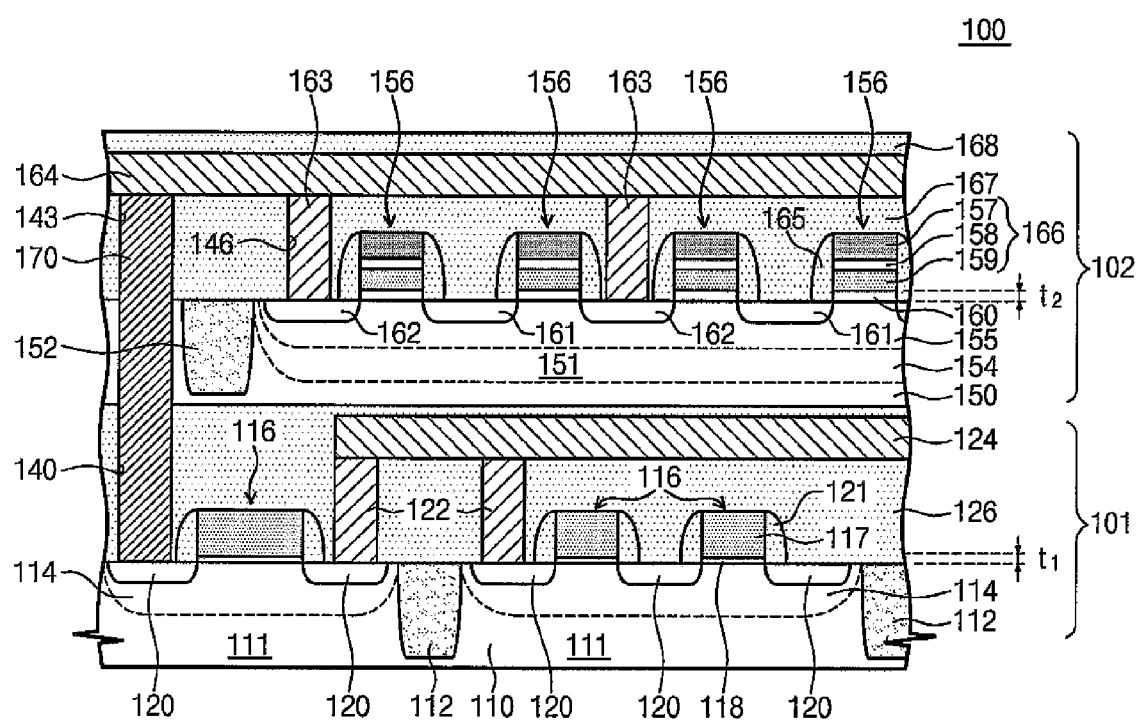

Referring to FIG. 3D, conductive material is deposited on the insulation layer 167 and patterned to form a bit line 164. The bit line 164 is electrically connected to the via 170 directly. The bit line 164 is also electrically connected to the contact plugs 163, and thus to the drains 162. Furthermore, an insulation layer 168 may be formed on the bit line 164 so as to cover the bit line 164. As a result, the logic circuit and the NOR flash memory circuit are formed on the first substrate 110 and the second substrate 150, respectively, and the logic circuit and the NOR flash memory circuit are electrically connected to each other through the via 170.

FIGS. 4A through 4D illustrate another embodiment of a method of manufacturing a semiconductor device according to the present invention.

Figure 4A:
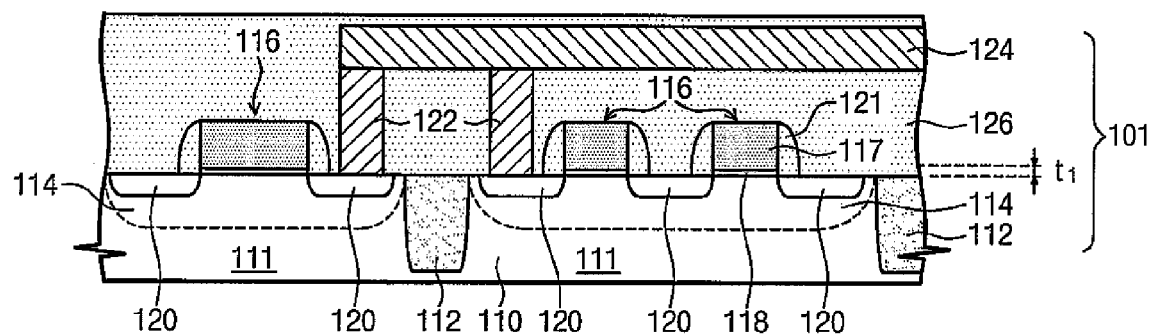
FIGS. 4A through 4D are sectional views illustrating yet another embodiment of a method of manufacturing a semiconductor device according to the present invention.

Referring to FIG. 4A, a first semiconductor layer 101 including a logic circuit is prepared. The first semiconductor layer 101 may be prepared using the same method described above with reference to FIG. 3A.

Figure 4B:
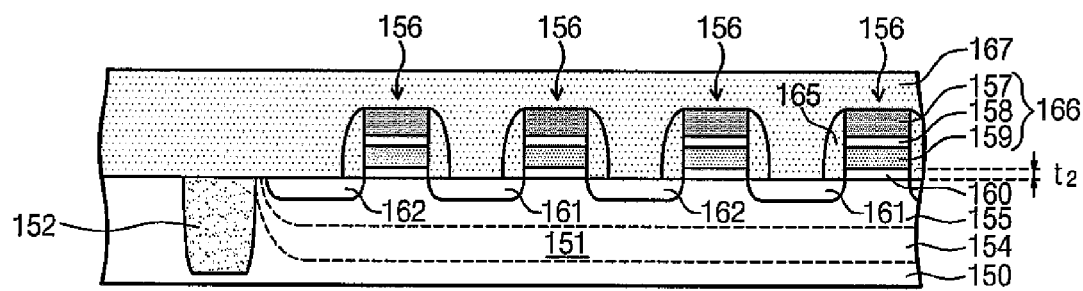

Referring to FIG. 4B, a second semiconductor substrate 150 having a plurality of memory transistors 156 covered with an insulation layer 167 is prepared. The method of preparing the second semiconductor substrate 150 may be the same as that described above with reference to FIG. 3B.

Figure 4C:
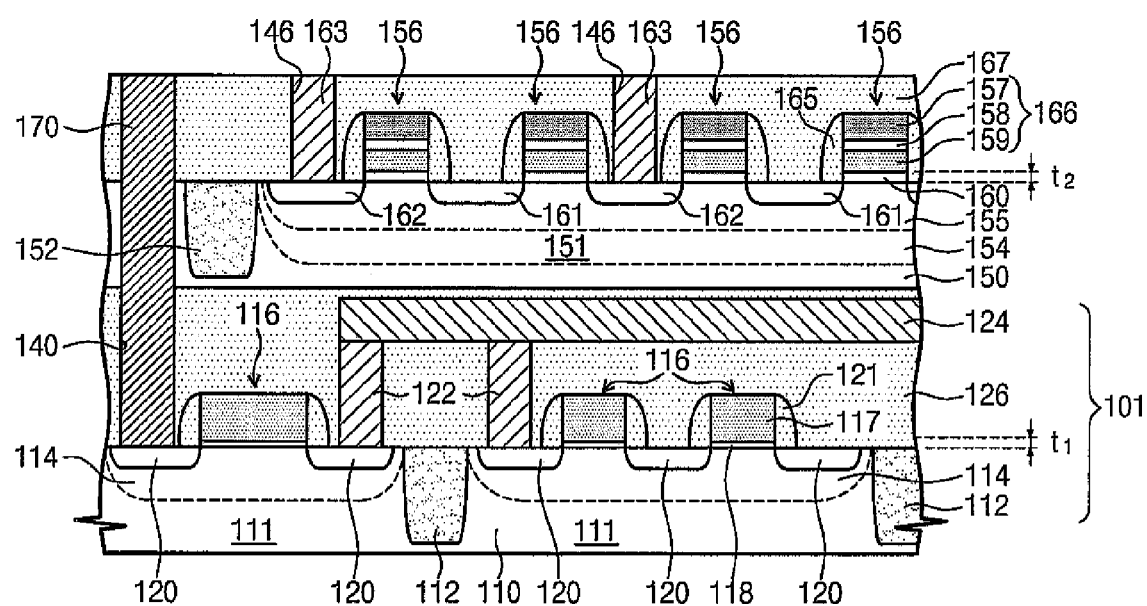

Referring to FIG. 4C, the second semiconductor substrate 150 is stacked on the first semiconductor layer 101. Also, a via hole 140 is formed through insulation layer 167, the second semiconductor substrate 150 and the insulation layer 126 of the first semiconductor layer 101 to expose a lateralmost one of the junction regions 120 of the first semiconductor layer 120. Subsequently, contact holes 146 are formed in the insulation layer 167 to expose respective ones of the drains 162. Alternatively, the via hole 140 and the contact holes 146 may be formed simultaneously. Next, the via hole 140 is filled with conductive material to form a via 170, and the contact holes 146 are filled with conductive material to form contact plugs 163. The via 170 and the contact plugs 163 may be formed simultaneously or sequentially.

Figure 4D:
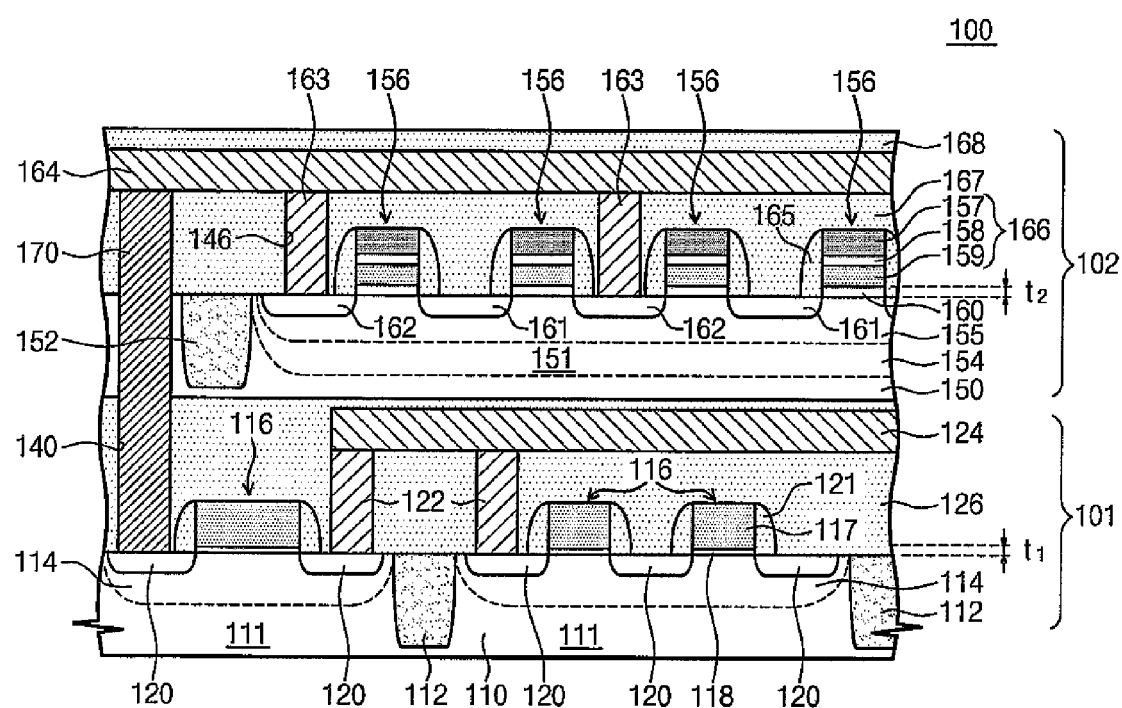

Referring to FIG. 4D, a bit line 164 is formed on the insulation layer 167 such that the bit line 164 is connected to the via 170 and to the contact plugs 163. Furthermore, an insulation layer 168 may be formed over the bit line 164 so as to cover the bit line 164. As a result, a logic circuit and a NOR flash memory circuit are formed on a first substrate 110 and the second substrate 150, respectively, and the logic circuit and the NOR flash memory circuit are electrically connected to each other through the via 170.

As described above, according to the present invention, the logic circuit and the memory circuit having the respective gate insulation layers are formed on different substrates, the substrates are stacked, and then the logic circuit and the memory circuit are electrically connected to each other through a via. Therefore, it is relatively easy to form the gate insulation layers of the logic circuit and memory circuits even though the layers have different thicknesses. Also, it is possible to readily manufacture semiconductor devices having identical logic circuits but different memory circuits (i.e., different kinds of memory circuits or memory circuits of various sizes) to meet consumer demand or market conditions.

Finally, the embodiments described above are considered illustrative and not limitative of the present invention. Thus, modifications, enhancements, and other changes to the disclosed embodiments are seen to fall within the true spirit and scope of the present invention as defined by the appended claims.

What is claimed is:

1. A multi-layered system on chip structure comprising a first layer having a set of first transistors, and a second layer stacked on the first layer and having a set of second transistors, the set of first transistors including a first patterned gate oxide layer and gates disposed on the first patterned gate oxide layer, the second set of transistors including a second patterned gate oxide layer and gates disposed on the second patterned gate oxide layer, and wherein the thickness of the first patterned gate oxide layer is different from the thickness of the second patterned gate oxide layer wherein the thickness of one of the first and second patterned gate oxide layers is about 15 Å to about 40 Å, and the thickness of the other of the first and second patterned gate oxide layers is about 50 Å to about 70Å.

2. The multi-layered system on chip structure of claim 1, wherein the first layer comprises a logic circuit including the first set of transistors, and the second layer comprises a memory circuit including the second set of transistors.

3. The multi-layered system on chip structure of claim 2, wherein the thickness of the first patterned gate oxide layer is about 15 Å to about 40 Å, and the thickness of the second patterned gate oxide layer is about 50 Å to about 70Å.

4. The multi-layered system on chip structure of claim 2, wherein each of the second transistors includes a floating gate, an insulation layer and a control gate stacked on atop the other on the second patterned gate oxide layer.

5. The multi-layered system on chip structure of claim 2, wherein the second layer includes insulation covering the second set of transistors, and the memory circuit includes a bit line, and conductive plugs extending in the insulation between junction regions of the second set of transistors and the bit line.

6. The multi-layered system on chip structure of claim 5, further comprising a via extending from a junction region of the first set of transistors through the insulation, and electrically connected to the memory circuit.

7. The multi-layered system on chip structure of claim 6, wherein the via extends from a junction region of a lateral-most one of the first transistors in the system on chip structure.

8. A semiconductor device comprising:
a first semiconductor layer including a first substrate and a first circuit disposed on the first substrate, the first circuit comprising at least one transistor having a gate insulation layer of a first thickness;
an insulating layer disposed on the first semiconductor layer;
a second semiconductor layer disposed on the insulating layer, the second semiconductor layer including a second substrate and a second circuit disposed on the second substrate, the second circuit comprising at least one transistor having a gate insulation layer of a second thickness different from the first thickness; and
a via in the second semiconductor layer and the insulating layer, the via electrically connecting the first circuit and the second circuit,
wherein one of the first and second circuits comprises a logic circuit and the other of the first and second circuits comprises a memory circuit.

9. The semiconductor device of claim 8, wherein the logic circuit is a circuit which operates at a lower voltage than the memory circuit.

10. The semiconductor device of claim 9, wherein the second thickness is greater than the first thickness.

11. A semiconductor device comprising:
a first semiconductor substrate;
a logic circuit disposed on the first semiconductor substrate, the logic circuit comprising a first transistor having a first gate insulation layer of a first thickness and a first insulation layer covering the first transistor;
a second semiconductor substrate disposed on the first semiconductor substrate;
a memory circuit disposed on the second semiconductor substrate, the memory circuit comprising a second transistor having a second gate insulation layer of a second thickness different from the first thickness, a bit line electrically connected to the second transistor, and insulation covering the second transistor; and
a via extending through the first insulation layer and the second semiconductor substrate and electrically connecting the logic circuit and the memory circuit.

12. The semiconductor device of claim 11, wherein the memory circuit further comprises a plug extending through the insulation covering the second transistor and electrically connecting the bit line and the via.

13. The semiconductor device of claim 11, wherein the logic circuit is a circuit which operates at a lower voltage than the memory circuit.

14. The semiconductor device of claim 11, wherein the second thickness is greater than the first thickness.

* * * * *